(12) United States Patent
Kato et al.

(10) Patent No.: US 6,179,127 B1
(45) Date of Patent: Jan. 30, 2001

(54) CARRIER TAPE AND DIE APPARATUS FOR FORMING SAME

(75) Inventors: Hiroshi Kato; Tomoyasu Kato; Yasuyuki Takao, all of Saitama (JP)

(73) Assignee: Shin-Etsu Polymer Co., Ltd. (JP)

( * ) Notice: Under 35 U.S.C. 154(b), the term of this patent shall be extended for 0 days.

(21) Appl. No.: 08/950,060

(22) Filed: Oct. 14, 1997

(30) Foreign Application Priority Data

Oct. 18, 1996 (JP) .................................................... 8-295864

(51) Int. Cl.[7] .................................................. B65D 85/86

(52) U.S. Cl. ................................................. 206/714; 206/725
(58) Field of Search ..................................... 206/713, 714, 206/725, 330, 331

(56) References Cited

U.S. PATENT DOCUMENTS

| | | | |
|---|---|---|---|
| 2,821,307 | * 1/1958 | Linsley | 206/725 X |
| 5,076,427 | 12/1991 | Thomson et al. | |
| 5,152,393 | * 10/1992 | Olenoweth | 206/714 |
| 5,361,901 | * 11/1994 | Schens et al. | 206/714 |

FOREIGN PATENT DOCUMENTS

| | | | |
|---|---|---|---|
| 0258573 | * 10/1990 | (JP) | 206/330 |
| 8-11930 | 1/1996 | (JP) . | |

* cited by examiner

*Primary Examiner*—Bryon P. Gehman
(74) *Attorney, Agent, or Firm*—Lerner, David, Littenberg, Krumholz & Mentlik, LLP

(57) ABSTRACT

A carrier tape capable of being formed by means of a die apparatus readily manufactured and exhibiting increased durability. The carrier tape is formed thereon with a plurality of receiving recesses for respectively receiving semiconductor packages therein in a manner to be spaced from each other at predetermined intervals in a longitudinal direction thereof. The receiving recesses are each provided at four corners thereof with shelf sections in a manner to be expanded outwardly from an opening of the receiving recess in a plane direction, so that the shelf sections may have an increased area. The shelf sections act to support a periphery of a bottom surface of the semiconductor package thereon. The receiving recess is also provided with positioning sections for positioning the semiconductor package in the plane direction while keeping sides of the semiconductor package in contact therewith. The positioning sections are respectively arranged between an adjacent two of the shelf sections.

13 Claims, 9 Drawing Sheets

CARRIER TAPE AND DIE APPARATUS FOR FORMING SAME

BACKGROUND OF THE INVENTION

This invention relates to a carrier tape for receiving therein electronic components, and more particularly to a carrier tape suitable for receiving therein small-sized area types of semiconductor packages such as ball grid array packages (BGA), micro ball grid array packages ($\mu$BGA), chip scale packages (CSP), bare chips or the like and a die apparatus for forming the same.

A semiconductor package such as a $\mu$BGA or the like includes electrode terminals such as a plurality of electrodes, e.g. solder balls or solder bumps, or the like which are arranged in a matrix-like manner on a bottom surface of a chip mounting substrate or a bottom surface of a chip mold section. Such a semiconductor package, when the electrode terminals of the package are brought into direct contact with a carrier tape while receiving the package in the carrier tape, causes contamination of the electrode terminals, as well as deformation of the electrode terminals due to local application of load to the package. Such contamination of the electrode terminals leads to a failure in soldering of the electrode terminals during mounting of the semiconductor package. Such a failure in soldering is hard to be found because the electrode terminals of the semiconductor package are arranged on the bottom surface of the package which is hard to be observed.

In view of the foregoing, the assignee proposed a carrier tape which is constructed so as to prevent electrode terminals of a semiconductor package such as a $\mu$BGA or the like from being brought into direct contact with the carrier tape when the semiconductor package is received in the carrier tape, as disclosed in Japanese Patent Application Laid-Open Publication No. 11930/1996. The proposed carrier tape is formed on a surface thereof with a plurality of receiving depressions or recesses. The receiving recesses are each formed at a periphery thereof with shelf sections, so that a peripheral edge of a bottom surface of each of the semiconductor packages is supported on the shelf sections of the carrier tape while a side of the semiconductor package is abutted against a side surface of one of the receiving recesses to position the semiconductor package on the carrier tape.

In the proposed carrier tape, the shelf sections each include a shelf surface which has a groove formed by an edge of the side surface of a corresponding one of the receiving recesses, to thereby avoid any disadvantage due to a restriction on molding which causes a connection between the shelf surface and the side surface to be formed into an arcuate shape. More particularly, the carrier tape is made by pressure forming, vacuum forming, pressing or the like. Unfortunately, such forming techniques substantially fail to form the shelf surface of the shelf section in a manner to be perpendicularly contiguous to the side surface of the receiving recess due to a restriction on processing or machining accuracy of a forming die, so that the connection between the shelf surface and the side surface is inevitably formed into an arcuate shape. This causes a flat portion on the shelf surface to be decreased in area when the semiconductor package is received in the receiving recess, leading to a disadvantage that each of peripheral edges of the semiconductor package rides on each of the arcuate surfaces, resulting in looseness of the semiconductor package in the receiving recess being produced. Thus, the proposed carrier tape is intended to permit the groove formed on the shelf surface to remove an adverse effect of the arcuate surface, to thereby prevent such looseness of the semiconductor package.

Nevertheless, the carrier tape thus proposed in Japanese Patent Application Laid-Open Publication No. 11930/1996 requires that a strip-like projection for formation of the groove is formed on the forming die by fine processing or machining, so that manufacturing of the forming die is highly difficult and troublesome. Also, the strip-like projection is readily worn due to repeating of the forming, resulting in durability of the forming die being deteriorated.

SUMMARY OF THE INVENTION

The present invention has been made in view of the foregoing disadvantages of the prior art.

Accordingly, it is an object of the present invention to provide a carrier tape which is capable of being formed by means of a forming die which is readily manufactured and exhibits increased durability.

It is another object of the present invention to provide a carrier tape which is capable of stably receiving semiconductor packages therein while keeping electrodes thereof from being brought into contact therewith.

It is a further object of the present invention to provide a die apparatus which is capable of providing such a carrier tape as described above while being readily manufactured and exhibiting increased durability.

In accordance with one aspect of the present invention, a carrier tape is provided which is formed with a plurality of receiving recesses in a manner to be open on one surface thereof and be spaced from each other at predetermined intervals in a longitudinal direction thereof so as to receive therein electronic components each having electrodes provided on a bottom surface thereof, respectively. The receiving recesses are each provided on a periphery thereof with shelf sections of which a height upwardly rising from a bottom surface of the receiving recess is greater than a height of the electrodes of the electronic component and which are adapted to support thereon an outer peripheral portion of the bottom surface of the electronic component. The shelf sections are arranged so as to be spaced from each other in a peripheral direction of the receiving recess and so as to be expanded outwardly from the receiving recess in a plane direction. The receiving recesses are each provided with positioning sections for positioning the electronic component in the plane direction while keeping sides of the electronic component in contact therewith. The positioning sections are respectively arranged between an adjacent two of the shelf sections.

In a preferred embodiment of the present invention, the receiving recesses are each formed with a rectangular shape in plan, wherein the shelf sections are provided at four corners of the receiving recess, respectively, and the positioning sections are respectively arranged in a manner to be contiguous to an adjacent two of the shelf sections. The side surface of the receiving recess is desirably constructed so as to act as the positioning sections.

In a preferred embodiment of the present invention, the positioning sections are each arranged in a manner to extend over the whole depth of the receiving recess.

In a preferred embodiment of the present invention, the positioning sections are each formed at an upper portion thereof with an inclined surface which spreads toward the one surface of the carrier tape at a predetermined angle with respect to a vertical direction perpendicular to the one surface of the carrier tape.

The carrier tape of the present invention thus constructed may be formed by subjecting a sheet of thermoplastic resin such as polystyrene, acrylonitrile-butadiene-styrene resin, polyethylene terephthalate, polypropylene, polyvinyl chloride, polycarbonatle or the like to vacuum forming, pressure forming, pressing or the like, wherein a plurality of sprocket perforations are formed on at least one of opposite sides of the carrier tape in a manner to be spaced from each other at predetermined intervals in a longitudinal direction of the carrier tape and in juxtaposition to the receiving recesses. The carrier tape is covered with a cover tape, resulting in the openings of the receiving recesses being closed after the electronic components are received in the respective receiving recesses.

The electronic component to which the present invention is applied may have electrode terminals for electrodes such as solder balls, solder bumps or the like and typically represented by a small-sized area type of semiconductor package such as a μBGA, CSP or the like as described above.

The receiving recesses are open on one surface or a front surface of the carrier tape and arranged so as to be spaced from each other at predetermined intervals in the longitudinal direction thereof. The receiving recesses are each formed with a configuration in plan which corresponds to that of the electronic component received therein. Typically, it is formed with a square or rectangular shape in plan.

In the carrier tape of the present invention, as described above, the shelf sections are each arranged on the periphery of the receiving recess so as to permit a portion of the periphery of the bottom surface of the electronic component positioned outwardly of the electrodes to be supported thereon and are formed with a height which keeps the electrodes of the electronic component supported on the shelf section from being brought into contact with the bottom surface of the receiving recess. The shelf sections are arranged in the receiving recess in a manner to be spaced from each other or contiguous to each other. Preferably, the shelf sections are arranged so as to be spaced from each other at equal intervals or be symmetrical with respect to each other. Also, the shelf sections are formed in a manner to be expanded outwardly from the receiving recess in the plane direction or planely. In other words, the shelf sections are each formed with a size or width sufficient to eliminate a necessity of forming the shelf section with high dimensional accuracy.

The positioning sections may each be provided by forming the receiving recess in a manner to permit an interval or distance between portions of the side surface of the receiving recess opposite to each other to correspond to a size of the electronic component or expanding the side surface of the receiving recess toward a center of the receiving recess. The positioning sections are arranged so as to be spaced from each other at angular intervals of 90 degrees or more in a circumferential direction of the receiving recess and desirably positioned between the shelf sections while corresponding in number to the shelf sections.

Also, in accordance with this aspect of the present invention, a carrier tape is provided which is formed with a plurality of receiving recesses in a manner to be open on one surface thereof and be spaced from each other at predetermined intervals in a longitudinal direction thereof so as to receive therein electronic components each having electrodes provided on a bottom surface thereof, respectively. The receiving recesses are each provided on a periphery thereof with step-like shelf sections which are adapted to support thereon a peripheral portion of the bottom surface of the electronic component. The shelf sections are each provided with a shelf surface of which a height upwardly rising from a bottom surface of the receiving recess to an inner edge of the shelf surface of the shelf section is greater than a height of the electrodes of the electronic component. The shelf surface is formed so as to be inclined toward the other surface of the carrier tape and extend toward a side surface of the receiving recess. The receiving recess is formed on the side surface thereof with positioning sections which are abutted against sides of the electronic component to position the electronic component in a plane direction.

In a preferred embodiment of the present invention, the shelf surface of each of the shelf sections is inclined at an angle within a range between 70 degrees and 85 degrees with respect to the side surface of the receiving recess.

In the carrier tape thus constructed, the shelf sections are each formed on the portion of the side surface of the receiving section adjacent to the bottom surface thereof and the shelf surface of the shelf section is formed at the inner edge thereof facing the center of the receiving recess with a height greater than that of the electrodes of the semiconductor package. Also, the receiving recess is so constructed that the portion thereof extending between the shelf surface and the opening acts as each of the positioning sections. An interval between the positioning sections opposite to each other is set to correspond to a size of the semiconductor package.

A thickness of the carrier tape is closely related to an angle of inclination of the shelf surface, thus, the shelf surface of the shelf section is desirably inclined at an angle within a range between 70 degrees and 85 degrees, as described above.

Further, in accordance with this aspect of the present invention, a carrier tape is provided which is formed with a plurality of receiving recesses in a manner to be open on one surface thereof and be spaced from each other at predetermined intervals in a longitudinal direction thereof so as to receive therein electronic components each having electrodes provided on the bottom surface thereof, respectively. The receiving recesses are each provided on a periphery thereof with step-like shelf sections which are adapted to support thereon a peripheral portion of a bottom surface of the electronic component and which have a height greater than a height of the electrodes of the electronic component. The shelf sections are each provided with a shelf surface. The receiving recesses are each provided with positioning sections for positioning the electronic component in a plane direction while keeping sides of the electronic component in contact with the positioning sections. The positioning sections are each arranged at a portion of the side surface of the receiving recess positioned above the shelf surface.

In a preferred embodiment of the present invention, the positioning sections are each arranged in a manner to extend from the shelf surface of the shelf section to an opening of the receiving recess.

In a preferred embodiment of the present invention, the positioning sections are each arranged in a manner to be spaced from the shelf surface of the shelf section.

In the carrier tape thus constructed, the shelf sections are each arranged along the periphery of the receiving recess and desirably along a peripheral edge thereof, like those disclosed in Japanese Patent Application Laid-Open Publication No. 11930/1996 described above. The positioning sections are each arranged at the outer edge of the shelf section facing the side surface of the receiving recess or at the portion of the side surface of the receiving recess above the shelf surface. Also, the positioning sections are each formed with an increased width in the plane direction.

In accordance with another aspect of the present invention, a forming die for forming a carrier tape including a plurality of receiving recesses which are arranged in a manner to be open on one surface thereof and spaced from each other at predetermined intervals and each of which is provided on a side surface thereof with a shelf section of a predetermined height is provided. The forming die includes a female die formed with a forming recess for forming the receiving recess of the carrier tape, a counterbore arranged at a periphery of the forming recess to form the shelf section of the carrier tape, and a cut-out relief arranged at an outer peripheral edge of a surface of the counterbore.

The forming die thus constructed is applied to pressure forming, vacuum forming, pressing or the like and combined with a male die when the pressing is carried out. In the female die, the forming recess and counterbore may be formed by a single member. Alternatively, the forming recess, counterbore and relief are formed by a combination of a plurality of members. The relief may be constituted by an aperture, a recess, a cutout or the like and provides a relief for the outer edge of the shelf surface of the shelf section facing the side surface of the receiving recess of the carrier tape. The relief may act only as a so-called relief. Alternatively, it may also act as an exhaust hole for vacuum molding or an air vent hole for pressure forming as well.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein.

DETAILED DESCRIPTION OF THE PREFERRED EMBODIMENTS

Now, a carrier tape according to the present invention will be described hereinafter with reference to the accompanying drawing.

Figure 1:
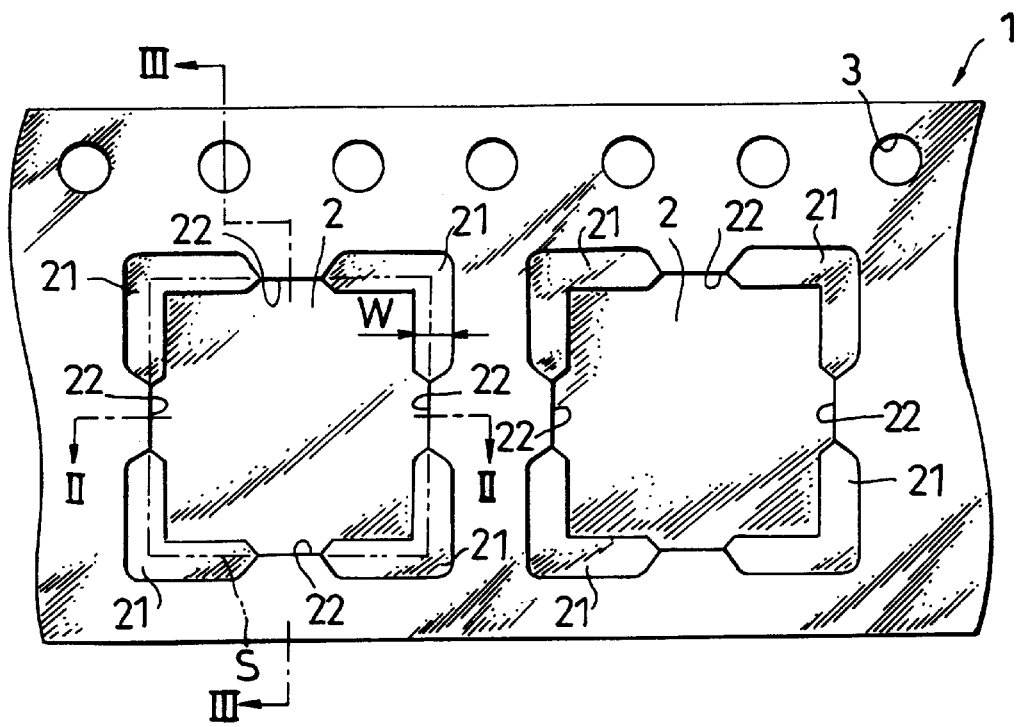
FIG. 1 is a fragmentary plan view showing an embodiment of a carrier tape according to the present invention.
Figure 2:
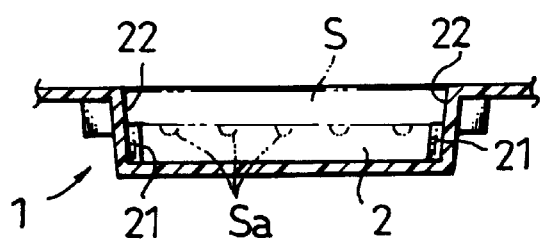
FIG. 2 is a sectional view taken along line II—II of FIG. 1.
Figure 3:
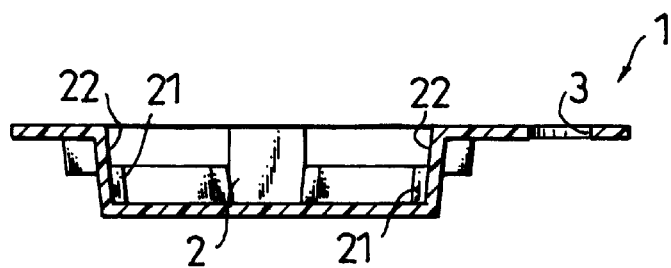
FIG. 3 is a sectional view taken along line III—III of FIG. 1.
Figure 4:
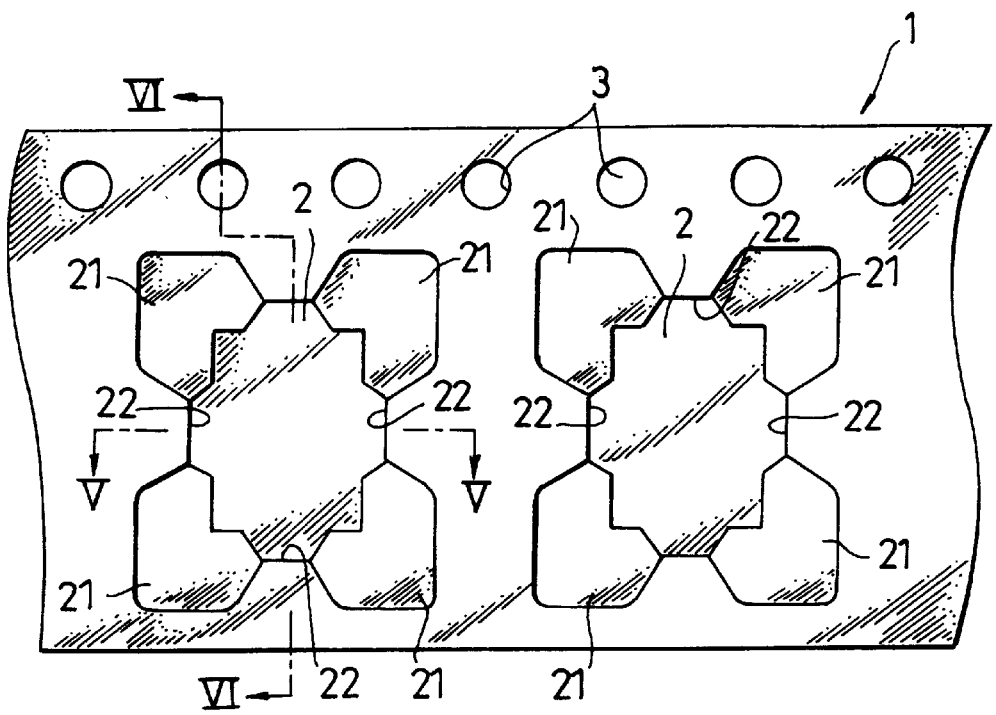
FIG. 4 is a fragmentary plan view showing a modification of the carrier tape of FIG. 1.
Figure 5:
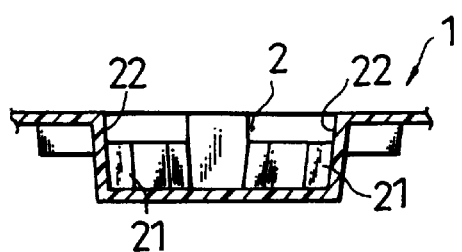
FIG. 5 is a sectional view taken along line V—V of FIG. 4.
Figure 6:
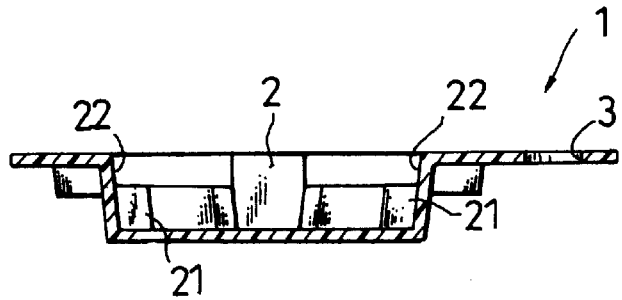
FIG. 6 is a sectional view taken along line VI—VI of FIG. 4.
Figure 7:
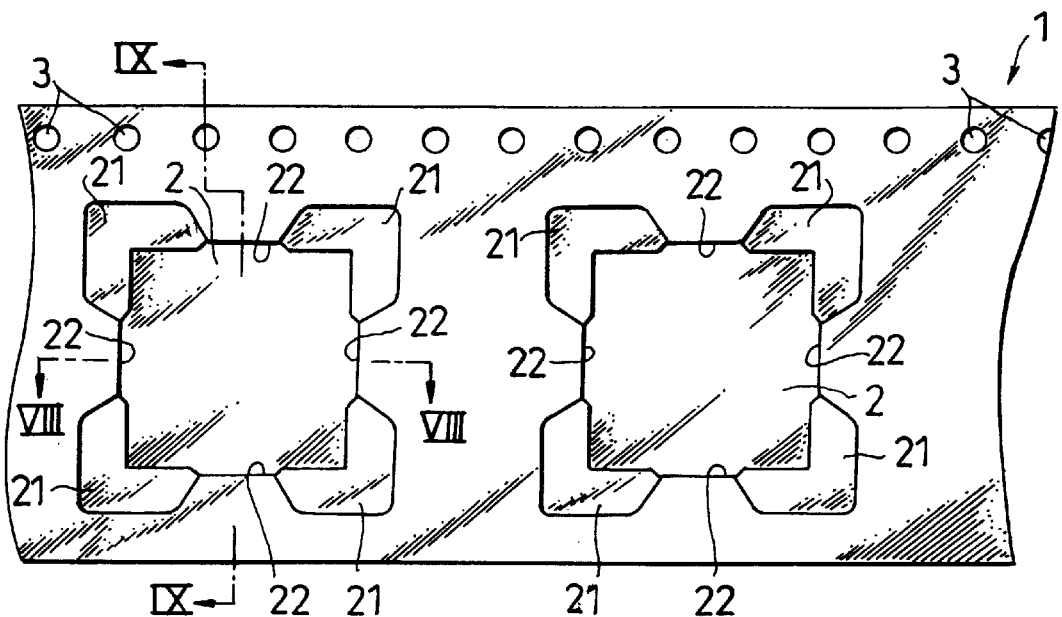
FIG. 7 is a fragmentary plan view showing another modification of the carrier tape of FIG. 1.
Figure 8:
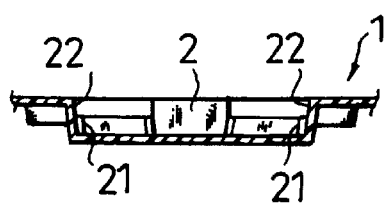
FIG. 8 is a sectional view taken along line VIII—VIII of FIG. 7.
Figure 9:
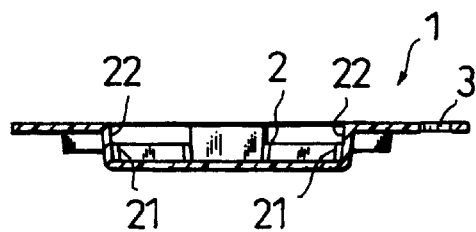
FIG. 9 is a sectional view taken along line IX—IX of FIG. 7.

Referring first to FIGS. 1 to 3, a first embodiment of a carrier tape according to the present invention is illustrated. In FIGS. 1 to 3, reference numeral 1 designates a carrier tape of the illustrated embodiment, which is formed with a plurality of receiving recesses 2 in a manner to be open on one surface of the carrier tape 1 and so as to be spaced from each other at predetermined intervals in a longitudinal direction thereof. In the illustrated embodiment, the receiving recesses 2 are each arranged so as to be open on a front or upper surface of the carrier tape 1. Also, the carrier tape 1 is formed on at least one of opposite sides thereof defined in a width direction thereof with a plurality of through-holes or sprocket perforations 3 in a manner to be spaced from each other at predetermined intervals. In the illustrated embodiment, the perforations 3 may be arranged in juxtaposition to the receiving recesses 2. The receiving recesses 2 of the carrier tape 1 each act to receive a semiconductor package S therein as described hereinafter.

The semiconductor package S is typically represented by that having electrodes Sa arranged in a matrix-like manner on a bottom thereof, like such a μBGA or CSP as described above.

The receiving recesses 2, as shown in FIG. 1, are each formed with a rectangular parallelopiped shape or a rectangular shape in plan and provided at each of four corners thereof with a shelf section 21. Also, each of the recesses 2 is provided with positioning sections 22 in a manner to be respectively interposed between an adjacent two of the shelf sections 21. The positioning sections 22 are each defined by a side surface arranged so as to approximately vertically extend from a bottom surface of the recess 2. The positioning sections 22 are so arranged that each two of the sections 22 opposite to each other are spaced from each other at an interval or distance substantially equal to or somewhat greater than a size of a body of the semiconductor package S.

The shelf section 21 is formed with a substantially L-shape in plan and in a step-like manner. The shelf section 21 is provided with an upper surface or shelf surface of which a height upwardly rising from the bottom surface of the receiving recess 2 is somewhat greater than a height of electrodes Sa of the semiconductor package S. Four such shelf sections 21 thus formed are so arranged that inner edges of the shelf surfaces of the shelf sections 21 facing a center of the receiving recess 2, in association with each other, define a configuration analogous to and smaller than that of the body of the semiconductor package. Such arrangement of the shelf sections 21 permits an outer peripheral portion of the semiconductor package S positioned outside the electrodes Sa arranged on the bottom surface thereof to be supported on the shelf surfaces of the shelf sections 21. Also, the shelf sections 21 are each formed with a width W sufficient to eliminate a necessity of forming the shelf section with high dimensional accuracy, so that an outer edge thereof is positioned outside an outer configuration of the semiconductor package S. The width W of the shelf section 21 is suitably determined in view of facilities for manufacturing of a forming die for the carrier tape, durability of the forming die and the like.

In the carrier tape 1 of the illustrated embodiment thus constructed, the semiconductor package S is received in each of the receiving recesses 2 while the peripheral portion of the bottom surface of the semiconductor package S is supported on the shelf surfaces of the shelf sections 21 and sides of the body of the package S is kept abutted against or in contact with the positioning sections 22, resulting in the semiconductor package S being positioned in the recess 2. Such construction effectively keeps the electrodes Sa of the semiconductor package S from being brought into contact with the bottom surface of the receiving recess 2, to thereby prevent contamination of the electrodes Sa, as well as deformation thereof due to application of force thereto.

The carrier tape 1 may be formed by pressure forming, vacuum forming or the like by means of a forming die while eliminating a necessity of forming the carrier tape with high dimensional accuracy. Thus, the forming die may be manufactured with ease and at a low cost while ensuring increased durability thereof. More specifically, the conventional carrier tape disclosed in Japanese Patent Application Laid-Open Publication No. 11930/1996 requires to form the fine grooves on the shelf surface of the shelf section, as described above. This requires to form a forming die with fine strip-like projections, resulting in manufacturing of the forming die being troublesome and costly. In addition, the fine strip-like projections are readily worn, leading to a deterioration in durability of the forming die. On the contrary, the carrier tape 1 of the illustrated embodiment are free from any fine portion such as fine grooves, to thereby eliminate the above-described disadvantages of the prior art.

The illustrated embodiment may be modified in such a manner as shown in either FIGS. 4 to 6 or FIGS. 7 to 9. In each of such modifications, shelf sections 21 are formed with dimensions including a width greater than those in the embodiment described above. The remaining part of each of the modifications may be constructed in substantially the same manner as the embodiment described above.

Figure 10:
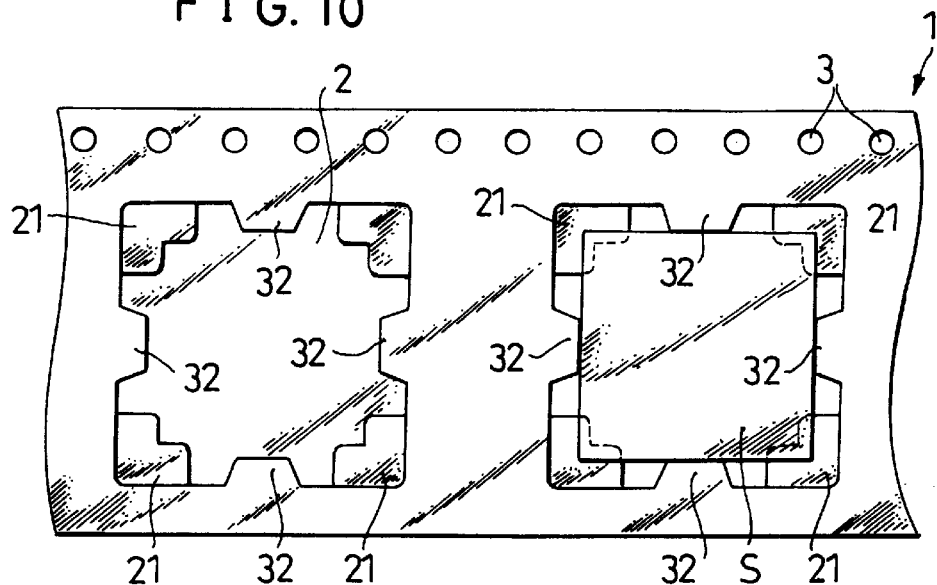
FIG. 10 is a fragmentary plan view showing another embodiment of a carrier tape according to the present invention.

Referring now to FIG. 10, a second embodiment of a carrier tape according to the present invention is illustrated. A carrier tape 1 of the illustrated embodiment likewise includes a plurality of receiving recesses 2, each of which is provided at each of four corners thereof with a shelf section 21. The receiving recess 2 also includes a side surface including four sides, each of which has a portion interposed between a corresponding adjacent two of the shelf sections 21. The thus-interposed portion of each of the sides of the receiving recess 2 is expanded toward a center of the receiving recess 2 over the whole depth of the receiving recess 2, to thereby provide a positioning section 32. The positioning sections 32 opposite to each other are arranged so as to be spaced from each other at an interval or distance somewhat greater than a size of a semiconductor package S as in the first embodiment described above, so that the semiconductor package S may be positioned in a plane direction or planely by means of the positioning sections 32. The remaining part of the second embodiment may be constructed in substantially the same manner as the first embodiment described above.

Figure 11:
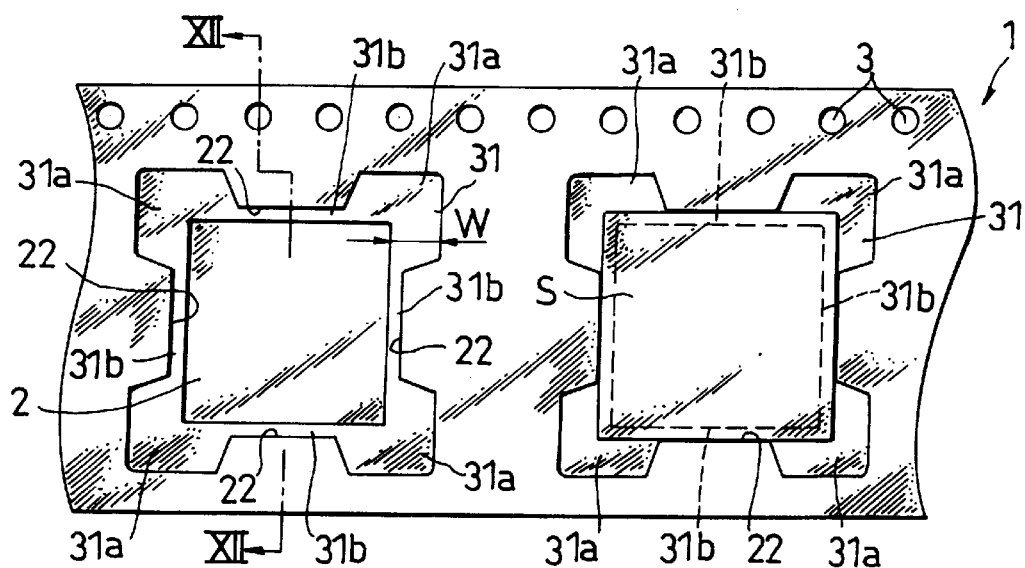
FIG. 11 is a fragmentary plan view showing a further embodiment of a carrier tape according to the present invention.
Figure 12:
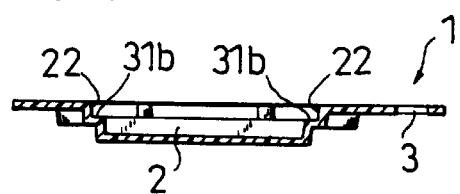
FIG. 12 is a sectional view taken along line XII—XII of FIG. 11.

Referring now to FIGS. 11 and 12, a third embodiment of a carrier tape according to the present invention is illustrated. A carrier tape 1 of the illustrated embodiment is likewise formed with a plurality of receiving recesses 2, each of which is provided on a whole periphery thereof with a shelf 31. The shelf 31 includes first shelf sections 31a of a wide width which are respectively arranged at four corners of the receiving recess 2 and second shelf sections 31b of a narrow width which are respectively arranged between an adjacent two of the first shelf sections 31a in a manner to be contiguous to the adjacent two first shelf sections 31a or so as to connect the two first shelf sections 31a to each other therethrough. The first shelf sections 31a of the wide width are each formed with a width W sufficient to eliminate a necessity of forming the shelf section with high dimensional accuracy.

The second shelf sections 31b of the narrow width are each formed with a width smaller than a distance between an edge of a bottom surface of a semiconductor package S and electrodes Sa arranged on the bottom surface of the package S, so that a peripheral portion of the bottom surface of the semiconductor package S may be supported on the second shelf sections 31b. The second shelf sections 31b thus constructed may be formed by means of a forming die described hereinafter with reference to FIG. 15 or FIG. 19. As described hereinafter, such forming by the die of FIG. 15 permits each of the second shelf sections 31b of the narrow width to have a shelf surface of which an outer periphery is downwardly inclined. In other words, the shelf surface is inclined at an angle smaller than 90 degrees with respect to a side surface of the receiving recess 2. The forming by the die shown in FIG. 19 permits the shelf surface of each of the second shelf sections 31b to be partially recessed or depressed at an outer periphery thereof.

The remaining part of the third embodiment may be constructed in substantially the same manner as the first embodiment described above.

Figure 13:
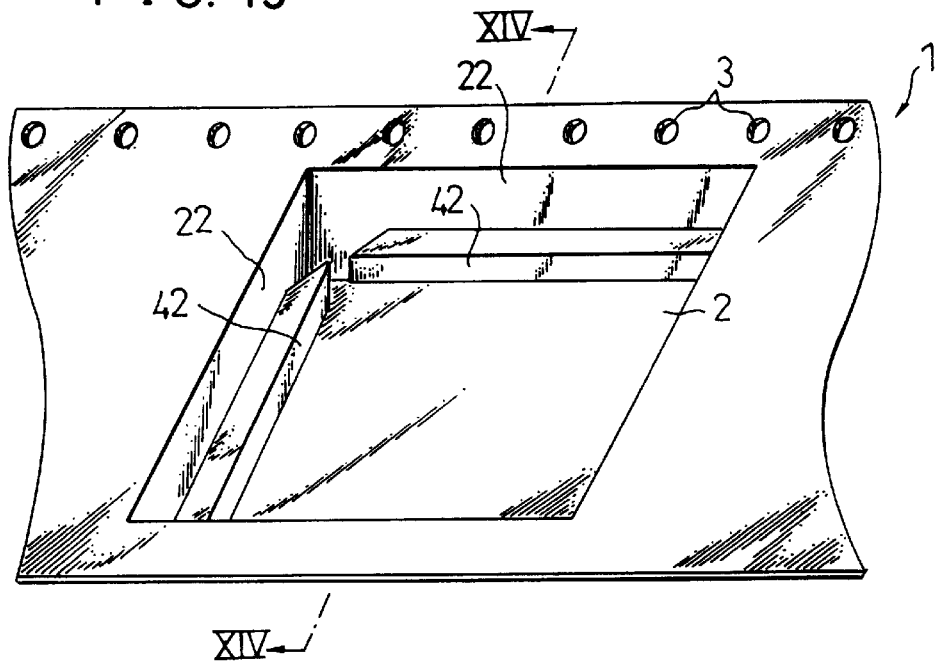
FIG. 13 is a fragmentary perspective view showing still another embodiment of a carrier tape according to the present invention.
Figure 14A:
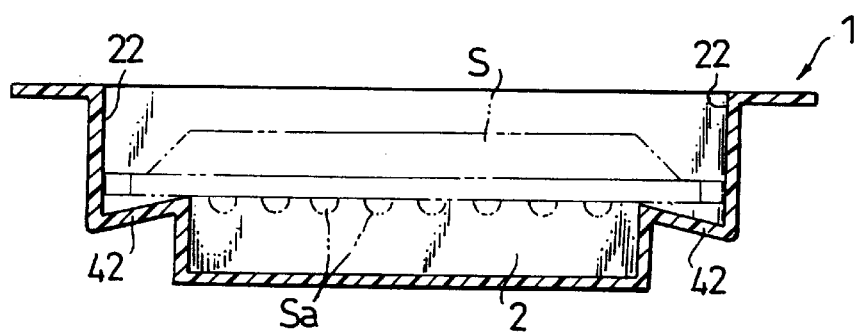
FIG. 14A is a sectional view taken along line XIV—XIV of FIG. 13.
Figure 14B:
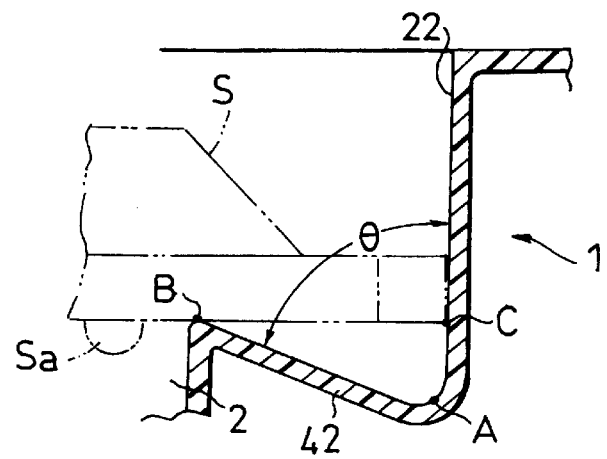
FIG. 14B is a fragmentary enlarged sectional view of the carrier tape shown in FIG. 13.

Referring now to FIGS. 13 to 14B, a fourth embodiment of a carrier tape according to the present invention is illustrated. A carrier tape 1 of the illustrated embodiment is so constructed that receiving recesses 2 are each provided on a portion of each of four sides of a side surface thereof adjacent to a bottom surface thereof with a shelf section 42. Also, the receiving recess 2 is so constructed that a portion of each of the sides of the side surface thereof positioned above a shelf surface of the shelf section 42 acts as a positioning section 22. The shelf sections 42 are each formed in such a manner that the shelf surface which is an upper surface of the shelf section is inclined downwardly toward the side surface of the receiving recess 2. More specifically, the shelf surface is formed so as to be inclined at an angle θ less than 90 degrees and preferably between 70 degrees and 85 degrees with respect to the side surface of the receiving recess 2. Also, the shelf sections 42 are each so constructed that a height thereof defined between an inner edge of the shelf surface and the bottom surface of the receiving recess 2 is greater than a height of electrodes Sa of a semiconductor package S, as in the embodiments described above.

More particularly, when an apex of an arcuate surface of an outer edge of the shelf surface is indicated by A, a point on the inner edge of the shelf surface with which the semiconductor package S is in contact is indicated by B, a point on the side surface or positioning section of the receiving recess 2 with which the semiconductor package S is in contact is indicated by C, and an angle of inclination of the shelf surface is indicated by θ; a length of a side AB and a length of a side AC are determined according to the following expressions (1) and (2), respectively:

$$AB = BC/\sin\theta \quad (1)$$

$$AC = BC/\tan\theta \quad (2)$$

Therefore, a length of a segment CAB obtained by adding the lengths of the sides AB and AC to each other after forming of the carrier tape is represented by the following expression (3):

$$CAB = BC/\sin\theta + BC/\tan\theta \quad (3)$$
$$= ((1 + \cos\theta)/\sin\theta)BC$$

As will be noted from the expression (3), a length of the segment CAB is $((1+\cos\theta)/\sin\theta)$ times as large as that obtained when the shelf surface is perpendicular ($\theta=90°$) to the side surface of the receiving recess 2. More specifically, it is about 1.43 times in the case of $\theta=70°$ and about 1.57 times in the case of $\theta=65°$. Unfortunately, when it exceeds 1.5 times, a thickness of the carrier tape 1 is reduced, resulting in strength thereof being reduced. Thus, the angular range described above is considered to be suitable.

In the carrier tape of the illustrated embodiment thus constructed, as shown in FIGS. 14A and 14B, the semiconductor package S is received in each of the receiving recesses 2 while a peripheral portion of a bottom surface of the semiconductor package S is supported or carried on the inner edge of the shelf surface of each of the shelf sections 42, so that the positioning sections 22 are abutted against sides of the semiconductor package S to position the package S. The shelf surface of each of the shelf sections 42 is inclined as described above, so that even when an outer edge of the shelf surface and the side surface of the receiving recess 2 are formed so as to be contiguous to each other through an arcuate surface, the semiconductor package S is prevented from riding on the arcuate surface. This results in the semiconductor package S being received in the carrier tape 1 without any looseness.

Figure 15:
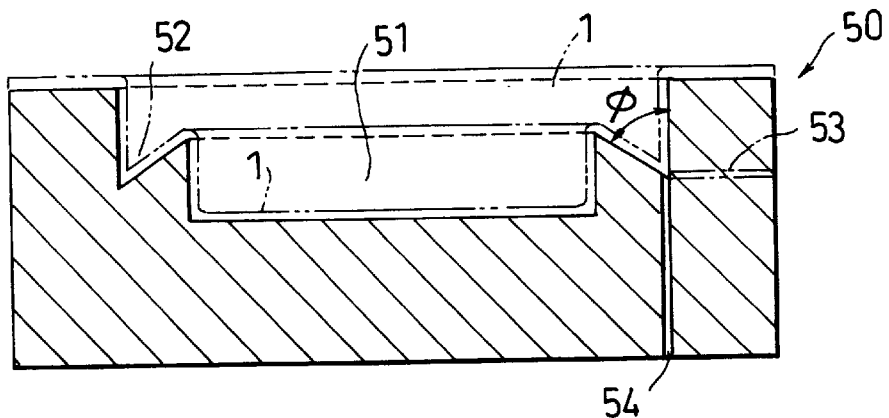
FIG. 15 is a schematic view showing a die apparatus for forming the carrier tape shown in FIG. 13.

The carrier tape 1 of the illustrated embodiment may be formed by pressing, pressure forming, vacuum forming or the like by means of a female die 50 shown in FIG. 15. The female die 50 includes a forming recess 51 and a counterbore 52 formed around a peripheral edge of an opening of the forming recess 51, wherein the forming recess 51 functions to form the receiving recess 2 of the carrier tape 1 and the counterbore 52 functions to form the shelf section 42. The counterbore 52 has a bottom surface formed so as to downwardly obliquely extend toward an outer periphery of the counterbore 52. The bottom surface of the counterbore 52 functions to form a shelf surface of the shelf section 42. Thus, an inclined angle φ of the bottom surface of the counterbore 52 defines the inclined angle θ of the shelf surface of the shelf section. In FIG. 15, reference numerals 53 and 54 each designate an air vent hole. Any one of the air vent holes 53 and 54 may be eliminated.

Formation of the carrier tape 1 by pressure forming or the like using the female die 50 thus constructed may be carried out by placing a sheet on the female die 50 and covering an outside of the sheet with an air box (not shown). Then, pressurized air is fed into the air box to act a pressure of the pressurized air on an upper surface of the sheet, to thereby press the sheet into the recess 51 and counterbore 52, leading to deformation of the sheet. This permits the sheet to be deformed in conformity to the forming recess 51 to provide the receiving recess 2, as well as deformed in conformity to the counterbore 52 to provide the shelf section 42 including the inclined shelf surface.

Figure 16A:
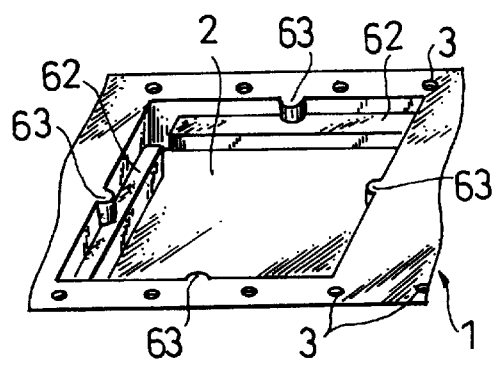
FIG. 16A is a fragmentary perspective view schematically showing yet another embodiment of a carrier tape according to the present invention.
Figure 16B:
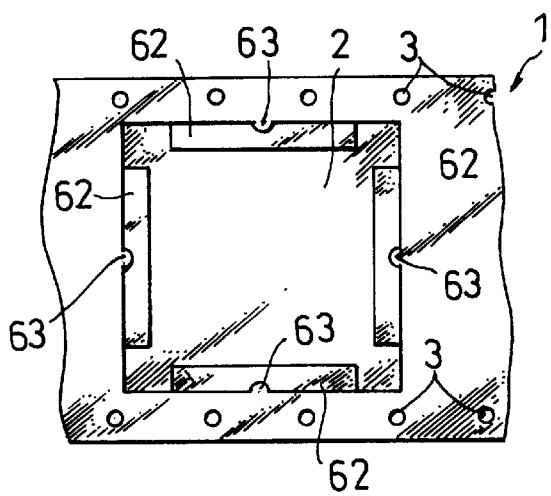
FIG. 16B is a fragmentary plan view of the carrier tape shown in FIG. 16A.

Referring now to FIGS. 16A and 16B, a fifth embodiment of a carrier tape according to the present invention is illustrated. In a carrier tape 1 of the illustrated embodiment, receiving recesses 2 each have shelf sections 62 formed along respective edges of four sides of a bottom surface thereof. The shelf sections 62 are each provided on a central portion thereof in a longitudinal direction thereof with a positioning section 63. The shelf sections 62 are each projectedly formed on a corresponding one of the four sides of the bottom surface of the receiving recess 2 and have a shelf surface formed at a height greater than a height of electrodes Sa of a semiconductor package S, as in each of the embodiments described above.

The positioning sections 63 are each formed with a substantially semicircular shape in plan and arranged in a manner to extend from the shelf surface of the shelf section 62 to an opening of the receiving recess 2. Also, the positioning sections 63 are so arranged that each two positioning sections opposite to each other are spaced from each other at an interval corresponding to a size of a body of the semiconductor package S, resulting in their being abutted against sides of the semiconductor package S to position it in a plane direction.

Alternatively, a plurality of such positioning sections 63 may be arranged on each of the shelf sections 62 in a manner to be spaced from each other in the longitudinal direction of the shelf section 62.

The remaining part of the illustrated embodiment may be constructed in substantially the same manner as each of the above-described embodiments.

In the carrier tape 1 of the illustrated embodiment as well, the semiconductor package S is received in each of the receiving recesses 2 while a peripheral portion of a bottom surface of the package S is supported on the shelf section 62. Concurrently, the semiconductor package S is positioned in a plane direction by means of the positioning sections 63. In this instance, the positioning sections 63 are each abutted against the semiconductor package S inward of an outer edge of the shelf surface of each of the shelf sections 62, so that the semiconductor package S is prevented from riding on an arcuate surface even when the outer edge of the shelf surface is contiguous to a side surface of the receiving recess 2 through the arcuate surface. This eliminates a necessity of subjecting a forming die for the carrier tape to fine machining or working and contributes to an increase in durability of the forming die.

Figure 17A:
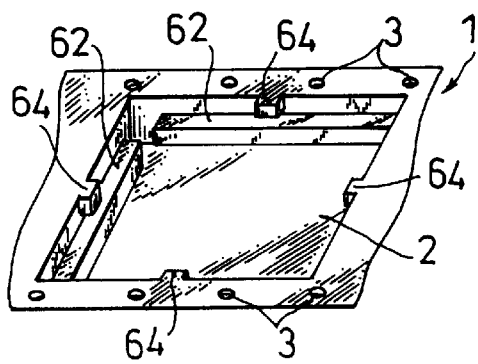
FIG. 17A is a fragmentary enlarged perspective view schematically showing a further embodiment of a carrier tape according to the present invention.
Figure 17B:
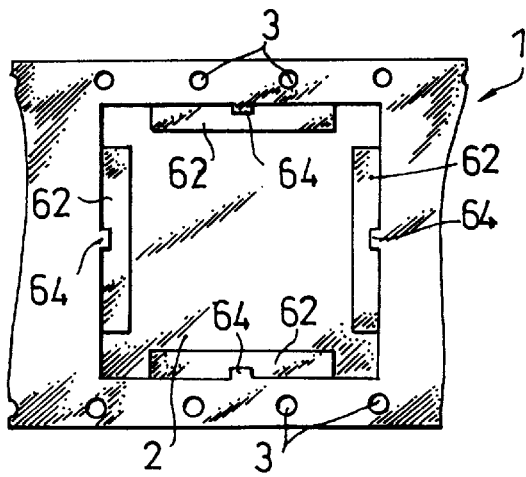
FIG. 17B is a fragmentary plan view of the carrier tape shown in FIG. 17A.

Referring now to FIGS. 17A and 17B, a sixth embodiment of a carrier tape according to the present invention is illustrated. A carrier tape 1 of the illustrated embodiment is constructed in such a manner that a positioning section 64 of a shape like a substantially rectangular pillar is provided on each of four sides defining a side surface of a corresponding one of receiving recesses 2 in a manner to be upwardly spaced from a shelf surface of each of shelf sections 62 and projected therefrom inwardly toward a center of the recess 2. Also, the positioning sections 64 are likewise arranged so that each adjacent two of the sections 64 opposite to each other are spaced from each other at an interval corresponding to a size of a semiconductor package S.

Figure 18A:
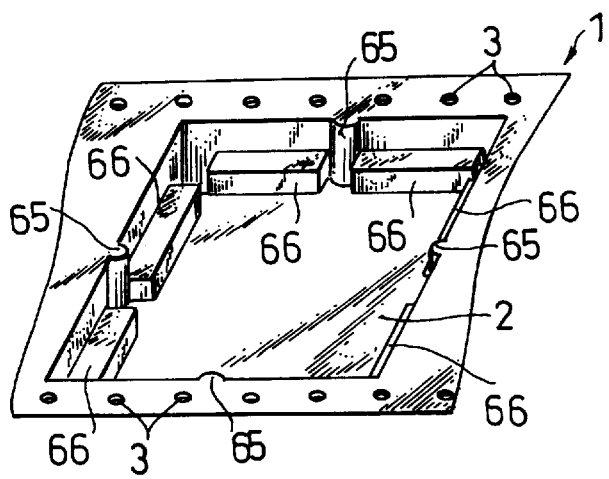
FIG. 18A is a fragmentary enlarged perspective view schematically showing a still further embodiment of a carrier tape according to the present invention.
Figure 18B:
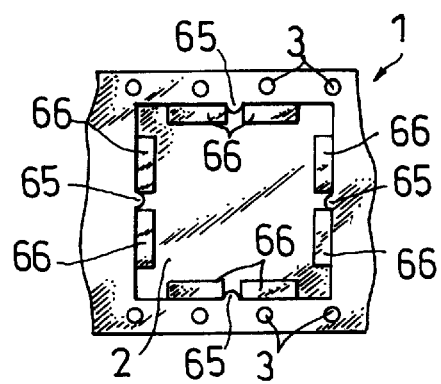
FIG. 18B is a fragmentary plan view of the carrier tape shown in FIG. 18A.

Referring now to FIGS. 18A and 18B, a seventh embodiment of a carrier tape according to the present invention is illustrated. In a carrier tape 1 of the illustrated embodiment, a positioning section 65 is arranged on a central portion of each of four sides defining a side surface of a receiving recess 2 so as to upwardly extend from a bottom surface of the receiving recess 2 through between shelf sections 66 to an edge of an opening of the receiving recess 2. The shelf sections 66 on each of the four sides of the side surface of the receiving recess 2 are arranged in a manner to interpose the positioning section 65 therebetween.

Figure 19A:
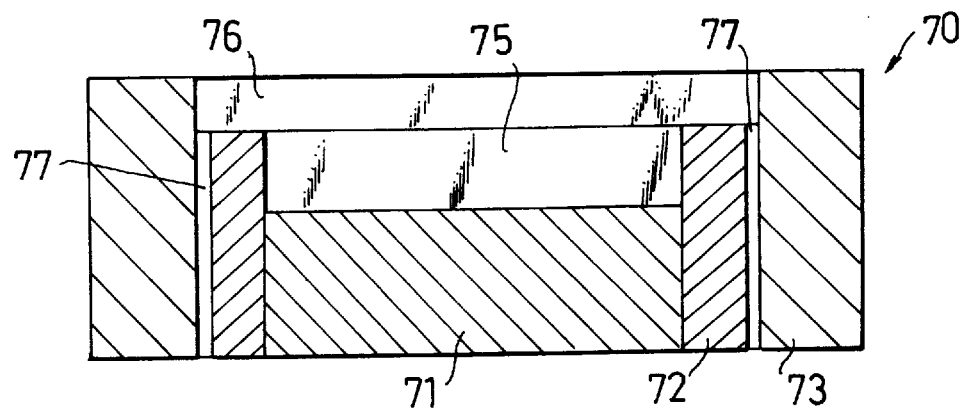
FIG. 19A is a fragmentary enlarged sectional view schematically showing a forming die apparatus according to the present invention.
Figure 19B:
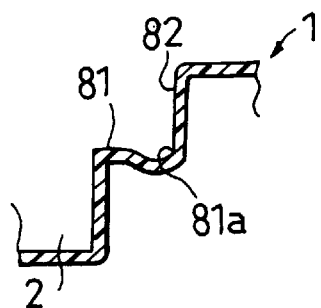
FIG. 19B is a fragmentary sectional view showing a carrier tape formed by the. forming die apparatus of FIG. 19A.

Referring now to FIGS. 19A and 19B, an embodiment of a forming die according to the present invention is illustrated, wherein FIG. 19A shows a forming die or female die 70 and FIG. 19B shows a part of a carrier tape 1 formed by the forming die 70 of FIG. 19A.

First, the carrier tape 1 will be described with reference to FIG. 19B. The carrier tape 1 is so constructed that receiving recesses 2 are each formed on four sides of a bottom surface thereof with respective shelf sections 81. Also, the receiving recess 2 is so constructed that a portion of each of four sides constituting a side surface thereof extending upwardly of a shelf surface of the shelf section 81 acts as a positioning section 82. Further, the shelf sections 82 are each formed at an outer edge of the shelf surface thereof contiguous to the side surface thereof with a depression 81a.

The carrier tape 1 thus constructed is formed by pressure forming or vacuum forming by means of the female die 70 shown in FIG. 19A. The female die 70 is constructed of three members 71, 72 and 73 for each of the receiving recesses 2 of the carrier tape 1. The female die 70 includes a recess 75, a counterbore 76 formed at an opening of the recess 75, and a relief 77 defined between the member 73 defining the counterbore 76 therein and the member 72 defining the recess 75 therein so as to be positioned at an outer edge of an upper surface of the counterbore 76.

Forming of the carrier tape 1 by means of the female die 70 thus constructed is carried out by placing a sheet on the female die 70 and pressing it into the recess 75 and counterbore 76 by means of compressed air in a manner like that described above with reference to FIG. 15. The female die 70, as described above, has the relief 77 formed along the outer edge of the upper surface of the counterbore 76, so that the sheet is deformed while being pressed into the relief 77, to thereby be formed with the depression 81a described above. The carrier tape 1 thus-formed is provided at the outer edge of the shelf section 81 with the depression 81a, resulting in a semiconductor package received in the receiving recess 2 being prevented from riding on an arcuate surface.

Figure 20:
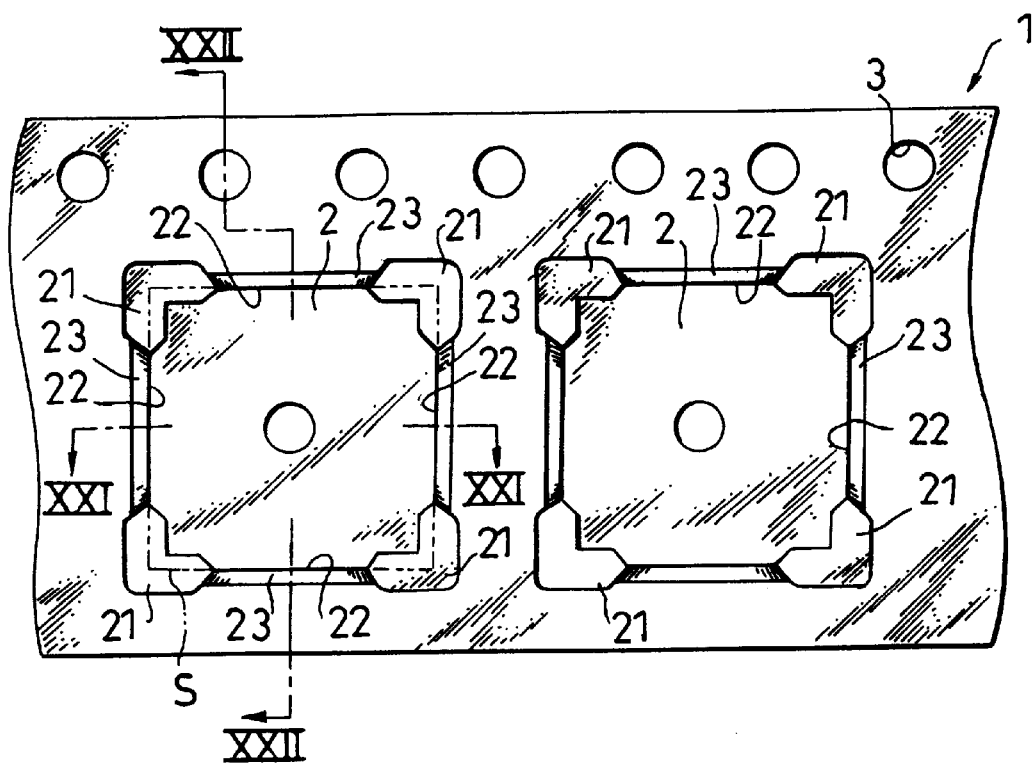
FIG. 20 is a fragmentary plan view showing a yet further embodiment of a carrier tape according to the present invention.
Figure 21:
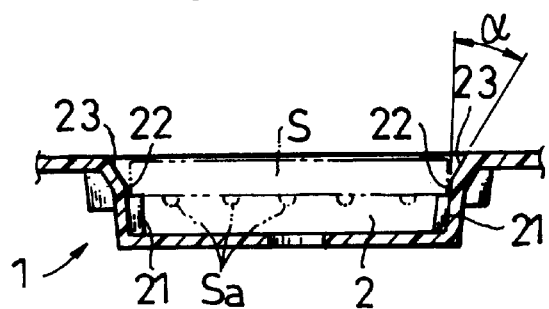
FIG. 21 is a sectional view taken along line XXI—XXI of FIG. 20.
Figure 22:
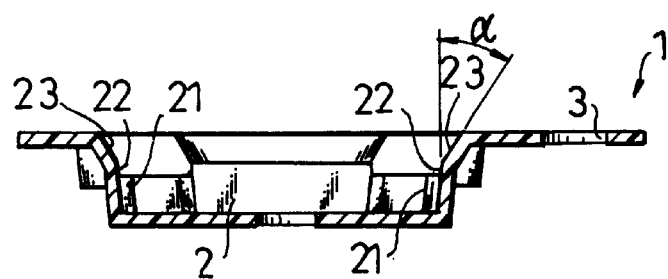
FIG. 22 is a sectional view taken along line XXII—XXII of FIG. 20.

In the carrier tape of each of the embodiments described above, the positioning sections and shelf sections are not limited to any specific configuration. The positioning sections may be configured as shown in FIGS. 20 to 22. More particularly, each of the positioning sections 22 may be formed at an upper portion thereof with an inclined surface 23 which upwardly spreads toward the front or upper surface of the carrier tape 1 at a predetermined angle or with respect to a vertical direction perpendicular to the upper surface of the carrier tape 1 and which terminates near a position corresponding to an outer peripheral edge of the shelf section 21. The angle $\alpha$ of the inclined surface 23 is suitably determined in view of a size and weight of a semiconductor package S, a friction coefficient between the surface of the carrier tape 1 and that of the semiconductor package S, and the like. For example, the angle a of the inclined surface 23 may be set within a range between 3 degrees and 15 degrees. In the carrier tape 1 of the illustrated embodiment, when the semiconductor package S is dropped into the receiving recess 2 of the carrier tape 1 from a taping apparatus while the center of the semiconductor package S is misaligned with respect to the center of the receiving recess 2, the semiconductor package S slides down toward the center of the receiving recess 2 along the inclined surfaces 23 which are disposed at the positioning sections 22 on the four sides of the receiving recess 2. As a result, the misalignment of the semiconductor package S is automatically corrected during its sliding along the inclined surfaces 23, resulting in the semiconductor package S being placed on the shelf sections 21 with the center thereof aligned with the center of the receiving recess 2.

Figure 23:
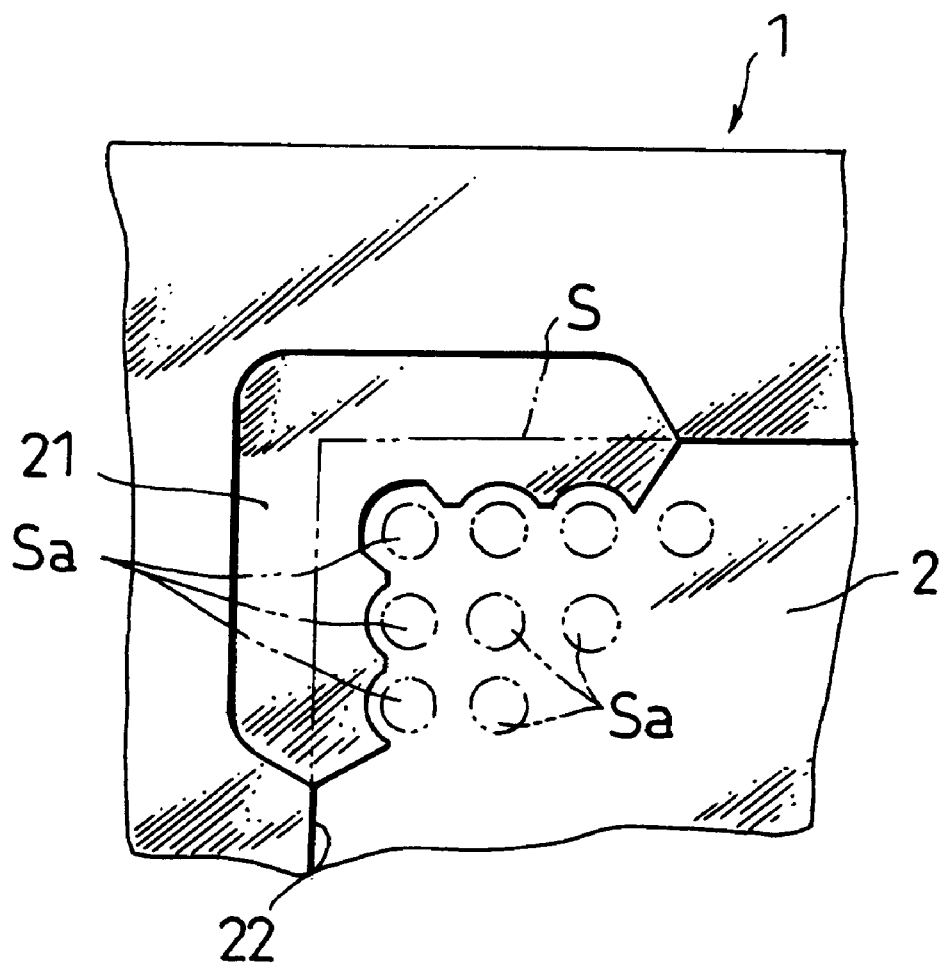
FIG. 23 is a fragmentary schematic plan view showing an even further embodiment of a carrier tape according to the present invention.

The shelf sections may each be configured as shown in FIG. 23. More particularly, each of the shelf sections designated by reference numeral 21 may be formed at an inner edge of the shelf surface thereof into a substantially corrugated configuration so as to avoid electrodes Sa arranged on a bottom surface of a semiconductor package S. Such configuration provides an increase in area of the bottom surface of the semiconductor package which is supported on the shelf sections.

As can be seen from the foregoing, the carrier tape of the present invention is so constructed that the receiving recesses are respectively formed with the shelf sections each including the shelf surface having an increased area, wherein a semiconductor package is supported at a peripheral portion of a bottom surface thereof on the inner edge of the shelf surface of each of the shelf sections. Such construction permits the receiving recess to stably receive therein the semiconductor package while keeping the electrodes of the semiconductor package from being brought into contact with the carrier tape. Also, it facilitates manufacturing of a forming die for the carrier tape and improves durability of the forming die.

In addition, in the carrier tape of the present invention, the shelf surface of the shelf section may be inclined so as to downwardly obliquely extend toward the outer edge thereof. Such configuration of the shelf surface likewise ensures that the semiconductor package is stably received in the receiving recess while the electrodes of the semiconductor package is kept from being brought into contact with the bottom surface of the receiving recess.

Further, the carrier tape of the present invention may be constructed in such a manner that the shelf sections are each arranged at the periphery of the receiving recess so as to support the periphery portion of the bottom surface of the semiconductor package thereon and the positioning sections are each arranged so as to be abutted against the sides of the semiconductor package inward of the outer edge of the shelf surface. Such construction likewise permits the receiving recess to stably receive therein the semiconductor package while keeping the electrodes of the semiconductor package from being brought into contact with the carrier tape, as well as facilitates manufacturing of a forming die for the carrier tape and improves durability of the forming die.

Moreover, the forming die of the present invention is so constructed that the step-like counterbore is arranged on the peripheral edge of the recess of the die for forming the receiving recess of the carrier tape and the relief is arranged at the outer peripheral edge of the upper surface of the counterbore in proximity to the member defining the recess of the die therein. Such construction permits the outer edge of the shelf surface of the shelf section of the carrier tape to be locally depressed, so that the semiconductor package may be prevented from riding on the arcuate surface between the shelf surface and the side wall of the receiving recess of the carrier tape.

While preferred embodiments of the invention have been described with reference to the drawings, obvious modifications and variations are possible in light of the above teachings. It is therefore to be understood that within the scope of the appended claims, the invention may be practiced otherwise than as specifically described.

What is claimed is:

1. A carrier tape formed with a plurality of receiving recesses in a manner to be open on one surface thereof and be spaced from each other at predetermined intervals in a longitudinal direction thereof so as to receive therein electronic components each having electrodes provided on a bottom surface thereof, respectively;

each said receiving recess being provided on a periphery thereof with shelf sections of which a height upwardly rising from a bottom surface of said receiving recess is greater than a height of the electrodes of the electronic component and which are adapted to support thereon an outer peripheral portion of the bottom surface of the electronic component;

said shelf sections being arranged so as to be spaced from each other in a peripheral direction of said receiving recess and so as to be expanded outwardly from said receiving recess in a plane direction;

said receiving recess being provided with positioning sections for positioning the electronic component in the plane direction while keeping sides of the electronic component in contact therewith;

said positioning sections being respectively arranged between an adjacent too of said shelf sections.

2. A carrier tape as defined in claim 1, wherein said receiving recesses are each formed with a rectangular shape in plan;

said shelf sections being provided at four corners of said receiving recess, respectively;

said positioning sections being respectively arranged in a manner to be contiguous to an adjacent two of said shelf sections.

3. A carrier tape as defined in claim 1, wherein said positioning sections are each arranged in a manner to extend over the whole depth of said receiving recess.

4. A carrier tape as defined in claim 1, wherein said positioning sections are each formed at an upper portion thereof with an inclined surface which spreads toward said one surface of the carrier tape at a predetermined angle with respect to a vertical direction perpendicular to said one surface of the carrier tape.

5. A carrier tape as defined in claim 4, wherein said predetermined angle of said inclined surface is set to be within a range between 3 degrees and 15 degrees.

6. A carrier tape formed with a plurality of receiving recesses in a manner to be open on one surface thereof and be spaced from each other at predetermined intervals in a longitudinal direction thereof so as to receive therein electronic components each having electrodes provided on a bottom surface thereof, respectively;

each said receiving recess being provided on a periphery thereof with step-like shelf sections which are adapted to support thereon a peripheral portion of the bottom surface of the electronic component;

each said shelf section being provided with a shelf surface of which a height upwardly rising from a bottom surface of said receiving recess to an inner edge of said shelf surface of said shelf section is greater than a height of the electrodes of the electronic component;

said shelf surface being formed so as to be inclined toward the other surface of the carrier tape and extend toward a side surface of said receiving recess;

said receiving recess being formed on the side surface thereof with positioning sections which will abut against sides of the electronic component to position the electronic component in a plane direction.

7. A carrier tape as defined in claim 6, wherein said shelf surface of each of said shelf sections is inclined at an angle within a range between 70 degrees and 85 degrees with respect to said side surface of said receiving recess.

8. A carrier tape as defined in claim 6, wherein said positioning sections are each formed at an upper portion thereof with an inclined surface which spreads toward said one surface of the carrier tape at a predetermined angle with respect to a vertical direction perpendicular to said one surface of the carrier tape.

9. A carrier tape formed with a plurality of receiving recesses in a manner to be open on one surface thereof and be spaced from each other at predetermined intervals in a longitudinal direction thereof so as to receive therein electronic components each having electrodes provided on a bottom surface thereof, respectively;

each said receiving recess being provided on a periphery thereof with step-like shelf sections which are adapted to support thereon a peripheral portion of the bottom surface of one electronic component and which have a height greater than a height of the electrodes of the electronic component, each said shelf section being provided with a shelf surface;

said receiving recess being provided with positioning sections for positioning the electronic component in a plane direction while keeping sides of the electronic component in contact with said positioning sections;

said positioning sections each being arranged at a portion of said side surface of said receiving recess positioned above said shelf surface.

10. A carrier tape as defined in claim 9, wherein said positioning sections are each arranged in a manner to extend over the whole depth of said receiving recess.

11. A carrier tape as defined in claim 9, wherein said positioning sections are each arranged in a manner to extend from said shelf surface of said shelf section to an opening of said receiving recess.

12. A carrier tape as defined in claim 9, wherein said positioning sections are each arranged in a manner to be spaced from said shelf surface of said shelf section.

13. A carrier tape as defined in claim 9, wherein said positioning sections are each formed at an upper portion thereof with an inclined surface which spreads toward said one surface of the carrier tape at a predetermined angle with respect to a vertical direction perpendicular to said one surface of the carrier tape.

* * * * *

UNITED STATES PATENT AND TRADEMARK OFFICE
CERTIFICATE OF CORRECTION

PATENT NO. : 6,179,127 B1　　　　　　　　　　　　　　　　　　　Page 1 of 1
DATED : January 30, 2001
INVENTOR(S) : Kato et al.

It is certified that error appears in the above-identified patent and that said Letters Patent is hereby corrected as shown below:

Column 7,
Line 65, delete "are" and insert therefor -- is --.

Column 9,
Line 9, after "surface" insert -- , --.
Line 10, after "section" insert -- , --.

Column 10,
Line 22, delete "act" and insert therefor -- create --.

Column 11,
Line 28, delete "between".

Column 12,
Line 12, delete "or" and insert therefor -- α --.
Line 20, delete "a" and insert therefor -- α --.
Line 64, delete "is" and insert therefor -- are --.

Column 13,
Line 54, "too" should read "two".

Signed and Sealed this

Twenty-fifth Day of September, 2001

Attest:

*Nicholas P. Godici*

NICHOLAS P. GODICI
*Attesting Officer*　　*Acting Director of the United States Patent and Trademark Office*